US006841339B2

(12) United States Patent
Morales

(10) Patent No.: US 6,841,339 B2
(45) Date of Patent: Jan. 11, 2005

(54) SILICON MICRO-MOLD AND METHOD FOR FABRICATION

(75) Inventor: Alfredo M. Morales, Livermore, CA (US)

(73) Assignee: Sandia National Laboratories, Livermore, CA (US)

( * ) Notice: Subject to any disclaimer, the term of this patent is extended or adjusted under 35 U.S.C. 154(b) by 299 days.

(21) Appl. No.: 10/072,394

(22) Filed: Feb. 5, 2002

(65) Prior Publication Data

US 2002/0093119 A1 Jul. 18, 2002

Related U.S. Application Data

(63) Continuation-in-part of application No. 09/636,002, filed on Aug. 9, 2000, now Pat. No. 6,477,225.

(51) Int. Cl.[7] ............................. C23F 1/00; B29C 33/40
(52) U.S. Cl. ............................. 430/320; 216/2; 216/39; 205/70
(58) Field of Search ............................. 430/320; 216/2, 216/39; 205/67, 70, 135

(56) References Cited

U.S. PATENT DOCUMENTS 6,242,163 B1 * 6/2001 Stampfl et al. ............. 430/322
6,551,849 B1 * 4/2003 Kenney ....................... 438/34

FOREIGN PATENT DOCUMENTS

CN          1262460      8/2000    ............. G03F/7/00

OTHER PUBLICATIONS

Becker, E.W.; Ehrfeld, W.; Hagmann, P.; Maner, A.; Muenchmeyer, D.; "Fabrication of microstructures with high aspect ratios and great structural heights by synchrotron radiation lithography, galvanoforming, and plastic moulding (LIGA process)," *Microelectronic Engineering*, vol. 4 (1986) pp. 35–56 Published by Elsevier Scientific Publishers B.V.

Ehrfeld, W.; Glashauser, W.; Muenchmeyer, D.; Schelb, W.; "Mask making for synchrotron radiation light," *Microelectronic Engineering*, vol. 5 (1986) pp. 463–470 Published by Elsevier Scientific Publishers B.V.

Ehrfeld, W.; Lehr, H.; "Deep x–ray lithography for the production of three–dimensional microstructures from metals, polymers, and ceramics," *Radiat. Phys. Chem.*, vol. 45 No. 3 (1995) pp. 349–365 Published by Pergamon Press, Elsevier Scientific Ltd.

Bhardwaj, J.K.; Ashraf, H.; "Advanced silicon etching using high density plasmas" *Proceedings of SPIE* vol. 2639 (1996) pp. 224–233 Published by SPIE—The International Society for Optical Engineering.

(List continued on next page.)

*Primary Examiner*—John A. McPherson
(74) *Attorney, Agent, or Firm*—Timothy P. Evans

(57) ABSTRACT

The present invention describes a method for rapidly fabricating a robust 3-dimensional silicon micro-mold for use in preparing complex metal micro-components. The process begins by depositing a conductive metal layer onto one surface of a silicon wafer. A thin photoresist and a standard lithographic mask are then used to transfer a trace image pattern onto the opposite surface of the wafer by exposing and developing the resist. The exposed portion of the silicon substrate is anisotropically etched through the wafer thickness down to conductive metal layer to provide an etched pattern consisting of a series of rectilinear channels and recesses in the silicon which serve as the silicon micro-mold. Microcomponents are prepared with this mold by first filling the mold channels and recesses with a metal deposit, typically by electroplating, and then removing the silicon micromold by chemical etching.

11 Claims, 4 Drawing Sheets

OTHER PUBLICATIONS

Ajmera, P.K.; Stadler, S.; Abdollahi, N.; "Development of a low–cost X–ray mask for high–aspect ratio MEM smart structures" *Proceedings of SPIE* vol. 3328 (1998) pp. 14–22 Published by SPIE—The International Society for Optical Engineering.

Shew, B.–Y.; Cheng, Y.; Shih, W.–P.; Lu, M.; Lee, W.H.; "High precision, low cost mask for deep x–ray lithography" *Microsystems Technology*, vol. 4 (1998) pp. 66–69 Published by Springer—Verlag.

Klein, J.; Guckel, D.P.; Siddons, D.J.; Johnson, E.D.; "X–ray masks for very deep X–rGy lithography" *Microsystems Technology*, vol. 4 (1998) pp. 70–73 Published by Springer—Verlag.

Sheu, J.T.; Chiang, S.; Su, S.; "Fabrication of intermediate mask for deep x–ray lithography" *Microsystems Technology*, vol. 4 (1998) pp. 74–76 Published by Springer—Verlag.

Chen, D.; Zhang, D.; Ding, G.; Zhao, X.; Zhang, J.; Yang, C.; Cai, B.; "DEM technique: A new three–dimensional micro fabrication technique for non–silicon materials" *Proceedings of SPIE* vol. 3680 No. 2 (1999) pp. 1099–1104 Published by SPIE—The International Society for Optical Engineering.

Harris, C.; Desta, Y.; Kelly, K.W.; Calderon, G.; "Inexpensive, quickly producable X–ray mask for LIGA" *Microsystems Technology*, vol. 5 (1999) pp. 189–195 Published by Springer—Verlag.

Coane, P.; Giasolli, R.; Ledger, S.; Lain, K.; Ling, Z.; Goettert, J.; "Fabrication of HARM structures by deep X–ray lithography using graphite mask technology" *Microsystems Technology*, vol. 6 (2000) pp. 94–98 Published by Springer—Verlag.

Chen, D.; Lei, W.; Wang, C.; Li, C.; Guo, X.; Mao, H.; Zhang, D.; Yi, F.; "New type of X–ray mask fabricated using inductively coupled plasma deepetching" *Microsystems Technology*, vol. 7 (2001) pp. 71–74 Published by Springer—Verlag.

* cited by examiner

SILICON MICRO-MOLD AND METHOD FOR FABRICATION

CROSS-REFERENCE TO RELATED APPLICATIONS

The following application for Patent is a Continuation-In-Part of U.S. patent application Ser. No. 09/636,002, filed Aug. 9, 2000, now U.S. Pat. No. 6,477,225, and claims priority thereto.

The United States Government has rights in this invention pursuant to Contract No. DE-AC04-94AL85000 between the United States Department of Energy and Sandia Corporation for the operation of Sandia National Laboratories.

BACKGROUND OF THE INVENTION

1. Field of the Invention

The present invention relates to a method for quickly providing silicon micro-molds for the fabrication of mechanical micro-components, particularly mold having very high aspect ratios wherein the mold has lateral feature dimensions on the order of microns while also having depth dimensions on the order of hundreds of microns. Furthermore, the present invention provides a silicon mold that does not change dimension or distort due to water absorption and/or due to thermal cycling, as do prior art mold materials such as polymethylmethacrylate ("PMMA").

2. Description of Related Art

A variety of methods are presently known for making microparts. U.S. Pat. No. 5,256,360 to Li, teaches the use of a precisely controlled micro-electrode discharge machine (EDM) to make the micro-filter mold and suggests the use of laser-beam micro-machining, or electron-beam micro-machining, as suitable alternative processes. However, Li ('360), also teaches that molds made using conventional integrated circuits (IC) processing and lithographic processes in silicon tend to incorporate high internal strain, are prone to damage, are expensive to produce, and thus not economical to manufacture.

Current methods for fabricating molds for LIGA micro-component rely on high fluence, high brightness x-ray sources, typically synchrotron generated x-rays that are carefully collimated and directed onto a pattern-forming lithographic mask that replicates the image of the mask pattern into a layer of polymethylmethacrylate (PMMA). X-rays falling onto the surface of the PMMA substrate disrupt the molecular bonding in the exposed region and render it sensitive to chemical attack. Thus, by carefully controlling the amount and spatial location of the x-ray radiation, very small and very detailed features can be reproduced in the PMMA substrate. This process, however, is slow and limited by the availability of the synchrotron sources having the necessary fluence to deeply penetrate the PMMA substrates used by those skilled in the art.

Another approach is clearly needed.

U.S. Pat. No. 5,501,893 to Laermer, et al. describes a lithographic technique for etching silicon, generally referred to as "anisotropic etching," where it is possible to achieve deeply extending trenches while simultaneously providing side walls which are as nearly parallel and vertical as desired. In order to achieve these geometries it is necessary to allow etching to progress only on the bottom of the etched trench in the silicon substrate and not on the walls of the trench. In particular, Laermer ('893) teaches a two-stage process for alternately etching an exposed silicon surface in a reactive ion plasma followed by coating the etched surfaces with a thin polymerized layer, wherein the polymer coating serves to protect the wall surfaces of the trench from action of the plasma since these surfaces do not directly face the incoming flux of plasma ions. However, the polymer layer applied to the "floor" surface of the trench quickly breaks down in the presence of the ion bombardment since this surface directly faces the incoming ions. The polymer layer, therefore, forms a very effective etching "stop" on those edges or surfaces not directly in the path of the ion flux allowing for directional etching.

The process continues in this manner, alternating etching steps with coating steps, until the predetermined etching depth of the structures in the silicon substrate is reached.

The inventors have realized that such a process can be used to create template structures out of silicon wherein the template structures comprise the inverse 3-dimensional image of the desired micro-components. The etched silicon wafer can therefore be used as a plating micro-mold into which a metal can be deposited, thereby forming the useful micro-component parts.

SUMMARY OF THE INVENTION

Therefore, it is an object of the present invention to provide a process for fabricating highly accurate, three dimensional silicon micro-molds for producing metal micro-component parts.

Another object of the invention is to provide a method for rapidly fabricating a three dimensional plating micro-mold having features exhibiting a height-to-width aspect ratio of greater than about 20-to-1.

It is another object to provide a three dimensional plating micro-mold from silicon.

It is another object of the invention to provide a three dimensional plating micro-mold wherein the mold pattern comprises a plurality of structural elements exhibiting features having lateral dimensions of 1 micron or less, and wherein the mold pattern further comprises an inverse image of the desired micro-component part.

Yet another object of the invention is to provide a three dimensional plating micro-mold having features exhibiting a height-to-width aspect ratio of greater than about 20-to-1.

Still another object of this invention is to provide a plating micro-mold that is thermally stable and that will not distort with exposure to moisture.

DETAILED DESCRIPTION OF THE INVENTION

Figure 1A:
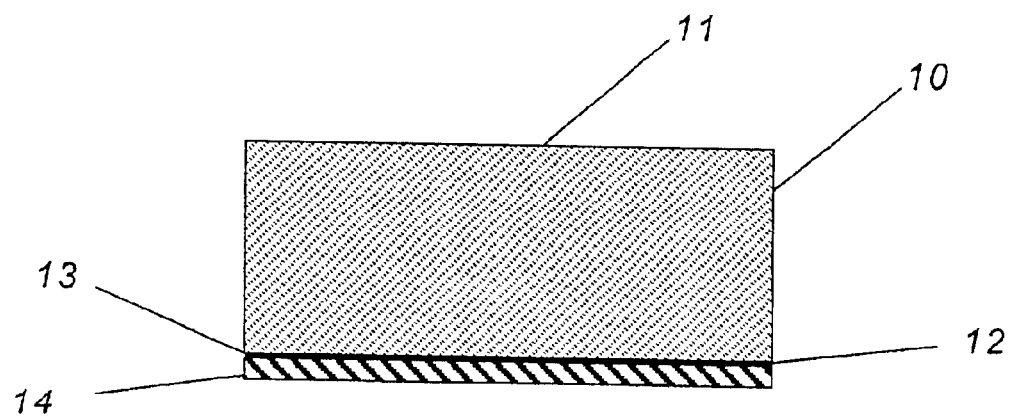
FIG. 1A shows the first step in an embodiment wherein a silicon substrate wafer, or the like, is provided and wherein one surface of the wafer is coated with first and second conductive metal layers to form a backing layer for providing a micro-component plating surface.

The present invention provides a process for rapidly fabricating a robust 3-dimensional silicon micro-mold for use in preparing complex metal micro-components. The present invention also provides a silicon mold capable of replicating structural elements exhibiting features having lateral dimensions of 1 micron or less. Such molds have great utility for producing metal and ceramic microparts since current technology provides molds having lateral feature sizes greater than 1 micron.

The instant invention employs a combination of processes to provide micro-molds which overcome these limitations. A lithographic mask is used to replicate the desired mold wall geometry into a layer of photoresist applied to an industry standard silicon wafer. The resist is then exposed to a source of high intensity light, developed to remove the undesired portion of the resist layer, and etched using a reactive plasma to provide a series of deep trenches through the thickness of the silicon wafer in the areas exposed by the resist removal, thereby providing the silicon micro-mold. Micro-component parts are prepared using the micro-mold by plating, or otherwise applying a metal deposit into the trenches in order to completely fill the trenches with the metal deposit. The surfaces of the plated micro-mold are subsequently planarized, and the underlying silicon substrate chemically removed to provide the finished micro-component.

General Description

The process begins with an industry standard silicon wafer. In one embodiment, a thick metal layer is first applied to one of the surfaces of the silicon wafer. The metal layer serves as an etch stop and to provide a conductive plating surface once the silicon wafer has been etched through from the opposite side of the wafer. In this embodiment the opposite surface of the silicon wafer must be etched through its full thickness to the opposite plated surface.

In the preferred embodiment, a layer of a lithographic photoresist is first applied to one surface of the silicon substrate wafer (the surface opposite the metal layer) such that the layer is about 2 microns thick. Any technique for applying such a resist layer may be used, including dipping, spraying, spinning or vapor depositing. Either organic or inorganic resists may be used. The method of application and the composition of the resist is not critical except for the need to provide a coating layer that can be completely (or nearly so) penetrated by the light source used. Furthermore, because the resist layer must act as an etch barrier to the reactive plasma used subsequently to anisotropically etch exposed portions of the silicon surface, the chosen composition once cured must be eroded by the plasma considerably more slowly than the silicon.

After the resist layer is applied, it is hard-baked, or otherwise cured, and the desired image pattern (the mold geometry) is rendered onto the resist layer surface by using any conventional lithographic process. These processes may include using a direct contact transmission mask, a non-contact reflecting mask and appropriate camera optics), or by using a direct "writing" technique, wherein the image is rendered by multiple passes of a programmable e-beam gun source. Important to the proper operation of the invention, however, is the ability of the exposing "light" to penetrate the full depth of the resist. Being able to fully penetrate the resist layer allows the practitioner to achieve the desired very small lateral dimensions. Use of a thin resist layer and a broadband light source help to satisfy this requirement.

After rendering the mask image into the resist, the resist layer is chemically "developed" and the exposed areas of the resist are either removed or retained, depending upon the specific resist chemistry used.

After developing the resist the patterned substrate is exposed to a series of anisotropic reactive etching steps such as those set forth in the so-called BOSCH process described in U.S. Pat. No. 5,501,893, herein incorporated by reference in its entirety. In this, or in any similar anisotropic silicon etching process, the top surface of the silicon substrate is protected by the retained resist layer while the exposed portions of the silicon surface are preferentially attacked by an active plasma. This first etching step is followed by a first polymerization step which coats the walls, edges and bases of the etched recesses in the silicon substrate. The plasma reactor parameters and etching times are adjusted and limited to avoid excessive damage to the resist layer and the process proceeds in this manner, alternating between etching and coating steps, until the full thickness of the silicon wafer has been penetrated.

Since the resist coating acts as an etchant barrier during subsequent processing, the amount of protection required will be determined by the processing necessary to provide the desired structure depth. Different combinations of resist compounds provide additional options. In the present case, a thin polymer resist is placed directly onto a silicon substrate, hard cured, masked and exposed to a source of broadband light. The resist used in the present invention provides for about a 50-to-1 processing protection ratio, meaning that every micron of applied resist will protect the covered areas of the silicon wafer from attack by the reactive plasma etchant for about as long as it will take the etchant to produce a 50 microns deep trench in the wafer. The resist used, therefore, provides a sufficiently robust etchant barrier to allow etching deep, narrow, channel structures in the silicon substrate. (This, of course, implies that the silicon substrate must be thinned to $\leq 100$ microns across the portion of the substrate intended for mold processing if a photoresist layer of 2 microns is used.)

Alternatively, a composite resist comprising a thin layer of conventional polymer resist may be applied over a thin silicon dioxide layer grown onto the silicon substrate, where UV light is used to create the image pattern. Such resists permit direct transfer of the image into a silicon dioxide (glass) "hard" resist which can then provide a processing protection ratio of 200-to-1.

After etching the silicon substrate, the remaining resist is stripped away, the silicon wafer cleaned, and oxidized in order to create a glassy ($SiO_2$) "release" layer along the walls of the micro-mold. A second, thicker deposit of an appropriate metal selected from one or more of the Transition metals listed in New IUPAC Groups 4–11 of the Periodic Table of Elements, tin and aluminum, or an alloy thereof, is applied so as to completely fill and cover the etched recesses. The metal application process is typically done by electroplating or by electroless deposition onto the backing layer but it may be done by any other method that provides an applied layer which is a continuous, uniform condensed layer. In addition, the thick layer may be laid down by vapor deposition, by plasma spraying, or by epitaxy deposition. Time and cost, however, favor a plating process.

Once plated, the filled micro-mold is planarized by lapping the top and bottom surfaces of the silicon micro-mold in order to remove the metal layer overlaying these surfaces, leaving surfaces that are flat and parallel. The remaining structure comprises a metal micro-component embedded in the thickness of the surrounding silicon micro-mold.

In a final step, the silicon micro-mold is removed by chemical or mechanical means until completely removed leaving only the metal micro-component.

Best Mode and Preferred Embodiment

A preferred embodiment of the invention steps is described with reference to FIGS. 1 through 3.

As required, detailed embodiments of the present invention are disclosed herein. However, it is to be understood that the disclosed embodiments are merely exemplary of the present invention which may be embodied in various systems. Therefore, specific details disclosed herein are not to be interpreted as limiting, but rather as a basis for the claims and as a representative basis for teaching one skilled in the art to variously practice the present invention.

Referring to FIG. 1A, the process begins with a silicon substrate or wafer 10. This substrate can, generally, have any useful shape and thickness but should of necessity be a thin wafer having parallel top and bottom surfaces 11 and 12, respectively. In particular, the present invention is most easily implemented by using an industry standard 100 mm Ø×0.67 mm thick wafer.

As indicated previously, it may be necessary to pre-thin the silicon wafer in order to prepare it for further process if a standard polymer photoresist is used.

Surface 12 of the clean substrate is coated with a metal layer 13, comprising about 0.01 microns to about 0.1 microns of vapor deposited chromium followed by about 0.03 microns to about 0.3 microns of vapor deposited gold to provide an adherent, conductive "metallize" layer. This initial layer is followed by a second thicker layer 14 of about 25–50 microns of gold. Thick metal layer 14 is deposited onto layer 13 by any method known to the art for applying such coatings including but not limited to electroplating, electroless deposition, vapor or particle deposition, or chemical vapor deposition. Metal layer 14 forms a mechanically robust "backing" layer that will eventually provide a plating surface for filling the silicon micro-mold. While layer 14 is disclosed herein as gold, it can be any of several of the oxidation resistant noble metals listed in New IUPAC Groups 9, 10 and 11 of the Periodic Table of Elements, or alloys thereof.

Figure 1B:
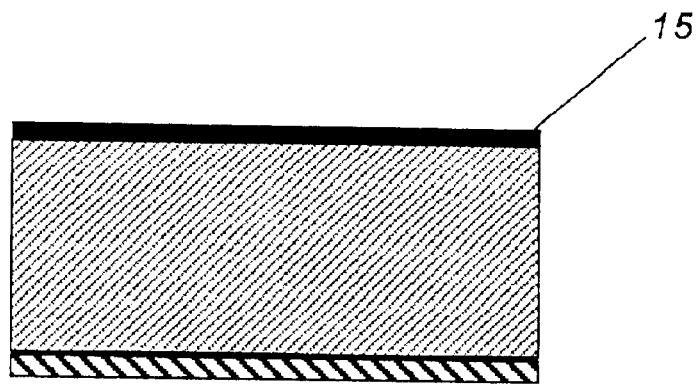
FIG. 1B shows the application of a positive (or negative) photoresist film onto a surface of the substrate wafer opposite the thick metal layer.

In FIG. 1B a liquid photoresist film 15 (herein 5740 Novolak manufactured by the Shipley Co., Inc.) is applied by spin coating to a thickness of about at least 2 microns and then hard-baked at about 95° C. in order to cure the layer. The particular resist thickness is chosen so as to balance the need for providing a thick enough layer to protect the unexposed portions of the silicon substrate from the effects of the later ion etch phase against the desire to fully expose the full thickness of the resist during the light exposure phase.

Figure 1C:
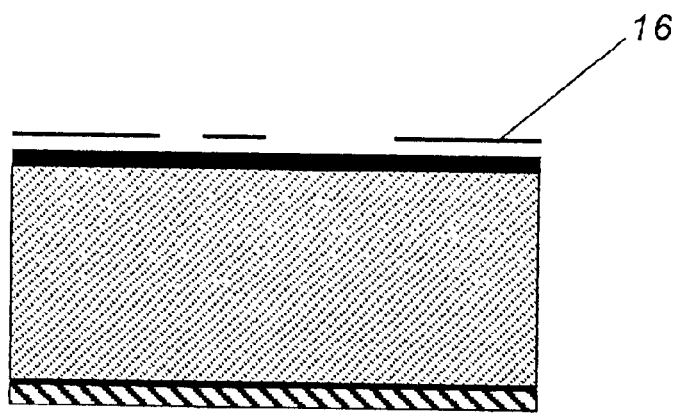
FIG. 1C shows the placement of a negative(positive) trace image mask over the photoresist.
Figure 1D:
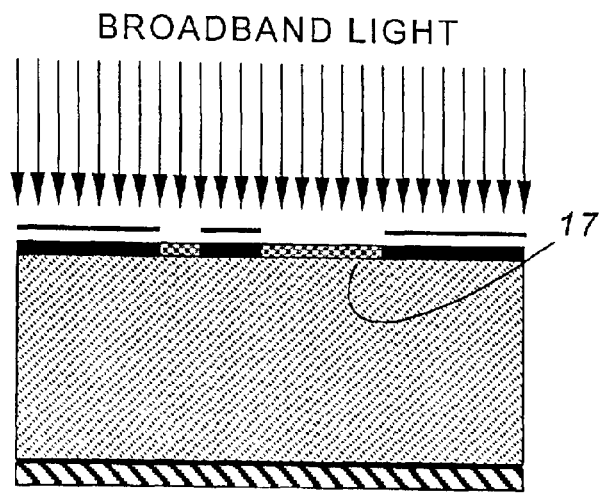
FIG. 1D shows the exposure of the uncovered portions of the photoresist film to a source of radiation in order to transfer a positive (negative) image of the mask image into the photoresist.

In order to render an image of the desired microcomponent into the resist layer 15, a standard direct-contact lithographic mask 16 (herein embodying a positive trace image of the desired mold pattern), is placed directly on the top surface of the resist, as shown in FIG. 1C (mask 16 is herein shown above the surface of the resist layer for clarity only). As shown in FIG. 1D, areas 17 of resist layer 15 located beneath open areas of mask 16, are subjected to a source of broadband light that renders them sensitive to chemical development. The exposure source (not shown) used herein is a high pressure mercury-vapor lamp emitting light over a spectral range of about 365 nm to 450 nm and providing a dose of approximately 80 millijoules/cm$^2$ measured at a wavelength of 365 nm.

Figure 1E:
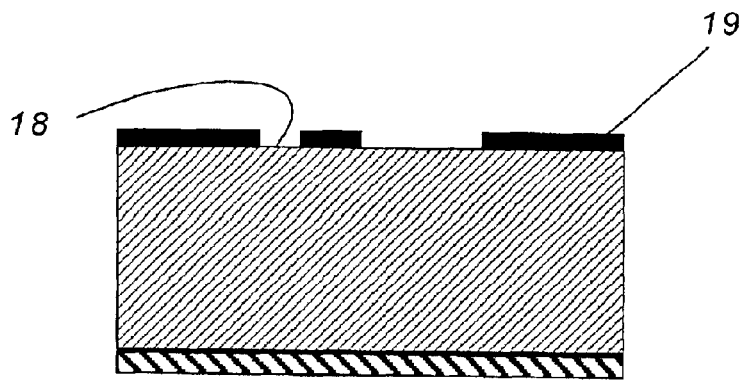
FIG. 1E shows the silicon substrate after portions of the photoresist layer are developed and removed thereby exposing portions of silicon substrate.

FIG. 1E illustrates the next step in the process, wherein the exposed portions 17, of photoresist layer 15, are chemically "developed" and removed leaving only unexposed portions 19, of layer 15 in an inverse image of the mask pattern surrounding "clear" areas 18 of exposed silicon. Again, the development step is performed using standard and well-known lithographic processes associated with the particular resist material employed.

It should be noted that the choice of a positive or negative image mask depends largely on the nature of the photoresist used, i.e., depending upon whether or not the exposed portion of the photoresist is removed or left intact after the resist has been developed. Either approach is possible; although, depending on the nature of the desired pattern, one is usually more preferred than the other.

Figure 1F:
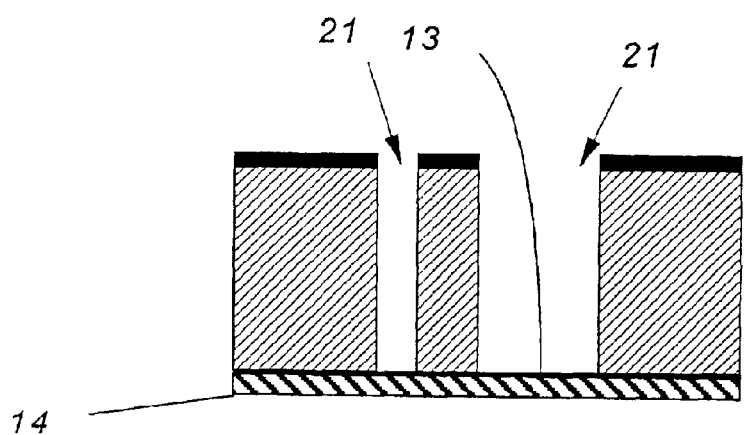
FIG. 1F illustrates the silicon substrate after the exposed portions of the substrate have been subjected to an etching plasma and etched through the thickness of the silicon wafer until the opposite side metal layer has been reached, thereby forming the silicon micro-mold.

After cleaning and drying, the patterned substrate 10 is subjected to an anisotropic reactive plasma etching process (not shown), such as the so-called BOSCH process described in U.S. Pat. No. 5,501,893, or any other similar etch-and-coat technique, wherein the exposed or "clear" areas 18 of the silicon substrate 10 are etched to a depth equal to the thickness of wafer 10 (or equal to the "thinned" portion of wafer 10) to provide a plurality of etched channels (also referred to herein as "trenches") 21, as shown in FIG. 1F. This step is capable of providing very high aspect ratio etched pattern such as is shown in FIG. 1F. As noted above, the BOSCH process is a two-step, etch-and-coat process wherein the intervening coating step comprises coating the exposed silicon with a thin layer of a polymer film that protects the walls and edges of the etched channel but is quickly destroyed on those surfaces which directly face the bombardment of the reactive plasma. This action has the effect of etching channels in the exposed silicon having a substantially uniform width and substantially parallel walls. The plasma etching process continues until the polymer film is consumed at which point it is stopped and a new layer of polymer film applied. The process repeats in this manner until the desired etch depth has been achieved. In the case of the present embodiment, the desired depth is substantially the full thickness of the silicon wafer wherein the chromium layer 13 is exposed.

Figure 2A:
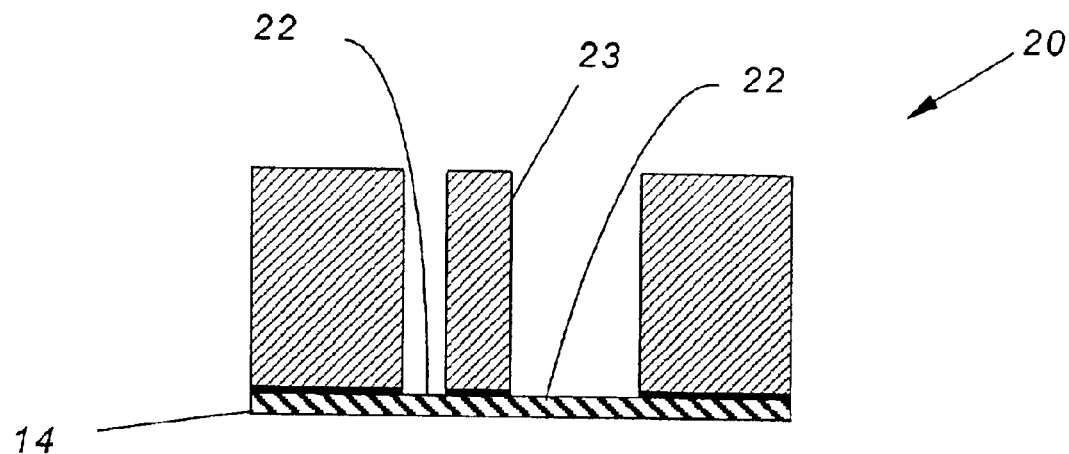
FIG. 2A shows the silicon substrate after the remaining resist and the exposed portions of the chromium "seed" layer have been removed to provide the silicon micro-mold.

Finally, in FIG. 2A, after etching silicon wafer 10 through to chromium layer 13, the remaining resist layer 19 is removed, the exposed portions of layer 13 are chemically removed to expose the underlying gold "backing" layer 14, and the part cleaned leaving wafer substrate 10 with a plurality of etched channels 21 that include wall surfaces 23, and floor surfaces 22, themselves comprising backing layer 14, to form the precursor silicon micro-mold 20 of embodiment one.

Figure 2B:
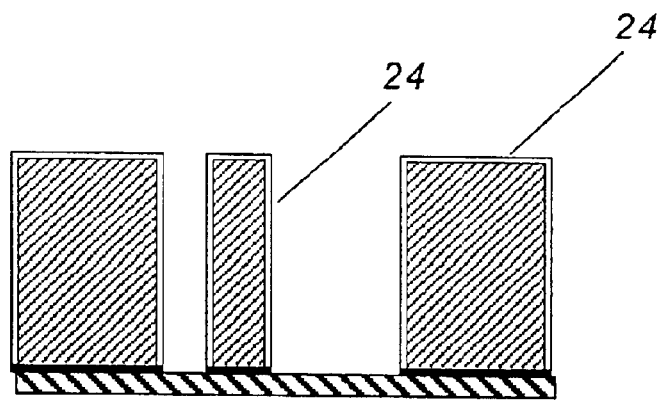
FIG. 2B shows the silicon substrate after the wall surfaces of the silicon micro-mold have been oxidized to form a $SiO_2$ release layer.

In FIG. 2B, the entire part is heated in an oxidizing atmosphere at about 900° C. for about an hour in order to create a sacrificial oxide layer 24 along each of the etched trench walls 23. This oxide layer is intended to facilitate releasing the metal micro-component from the micro-mold by providing a material layer that can be chemically attacked and consumed easily.

Figure 2C:
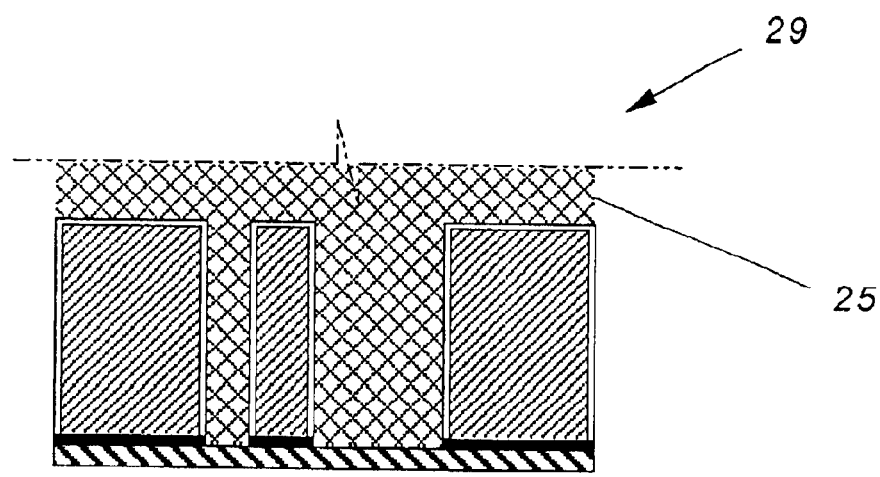
FIG. 2C shows the silicon micro-mold after the etched trenches have been filled with the plated metal layer.

FIG. 2C shows the formation of the metal micro-component in the silicon micro-mold. A final thick metal layer 25 is deposited into trenches 21, thereby form in the desired part. In the present invention, layer 25 is nickel but as before, the material may be any similar metal or combination of metals or alloys including most of the metals in the Transition series of metal listed in New IUPAC Group Numbers 4–11 of the Period Table of elements.

Figure 2D:
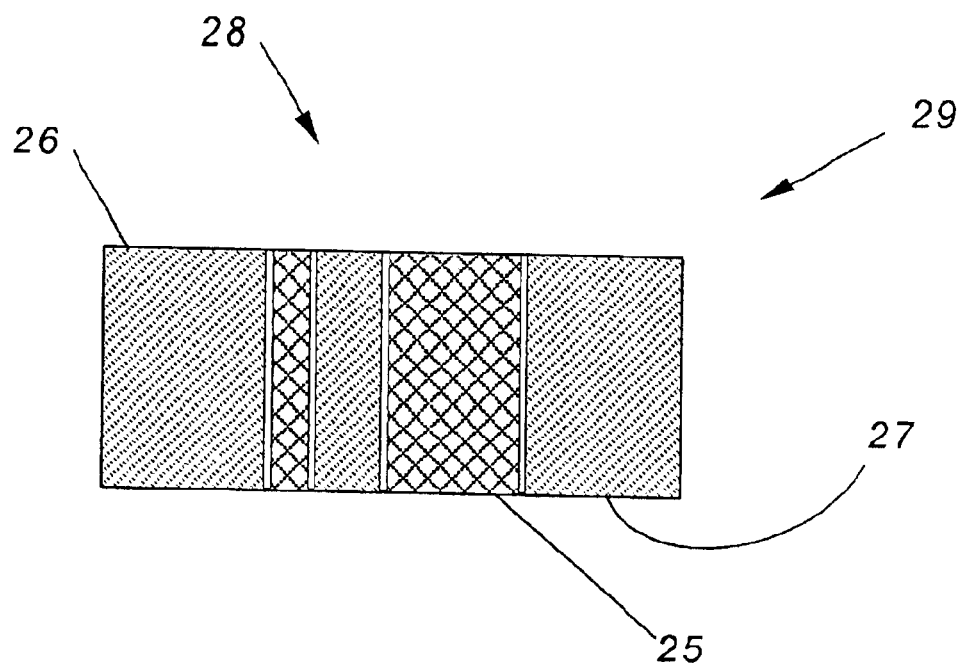
FIG. 2D shows the metal filled silicon micro-mold after the surfaces have been planarized to expose both end surfaces of the plated metal layer filling the etched portions of the silicon wafer.

Following the step of depositing the thick layer 25, the filled silicon micro-mold 29 is planarized, as shown in FIG. 2D, to remove metal from across the top and bottom surfaces of filled mold 29, thereby providing planarized surfaces 26 and 27. Planarizing is typically performed by lapping the top surface until the surface of the silicon is reached leaving only the embedded metal pattern 28 exposed. Planarized surfaces 26 and 27 are also intended to provide a flat, smooth, and well defined top and bottom surfaces for the metal mold assembly 29.

Figure 3:
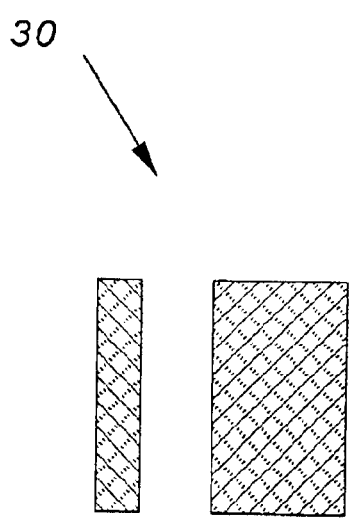
FIG. 3 shows a cross-sectional view of a micro-component after the removal of the silicon micro-mold.

The final step in the process, shown in FIG. 3, is the removal of the etched silicon wafer. The mold assembly 29 is chemically treated to preferentially consume the silicon oxide release layer 25 of silicon wafer 10 using a standard wet chemical etching technique such as, for example, hydrofluoric. Where there is no release layer the silicon may itself be chemically consumed using wet chemical etching techniques comprising potassium hydroxide.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. A method for making a silicon micro-mold, comprising the steps of:

providing a silicon substrate, said substrate having top and bottom surfaces and a thickness therebetween;

forming an electrically conductive layer onto said bottom surface;

forming a photoresist layer onto said top surface;

aligning an image patterning mask onto said photoresist layer, wherein said mask having closed portions for blocking light and open portions for allowing light to pass through;

directing a source of broadband light onto said mask, thereby exposing portions of said photoresist layer lying beneath said mask open portions;

removing said mask;

developing said photoresist layer so that a portion of said photoresist is removed to expose areas of said silicon substrate, and a portion of said photoresist remains as a protective etch barrier;

anisotropically etching said exposed areas of said silicon substrate through said substrate thickness to said electrically conductive layer, thereby providing a plurality of etched trenches comprising substantially vertical walls surfaces and floor surfaces comprising said electrically conductive layer;

removing said remaining photoresist; and oxidizing the surfaces of the silicon substrate after the step of removing said photoresist.

2. The method of claim 1, wherein the step of providing a silicon substrate comprises providing a silicon substrate that is an industry standard silicon wafer.

3. The method of claim 1, further comprising the step of depositing a metal layer onto said exposed areas and said electrically conductive layer, wherein said metal layer fills said plurality of etched trenches.

4. The method of claim 1, wherein the step of forming said electrically conductive layer comprises depositing a metal layer by particle or thermal vapor deposition.

5. The method of claim 1, wherein the step of forming a photo resist layer onto said substrate comprises spin-coating a Novolak photoresist layer on said substrate.

6. The method of claim 5, wherein the photoresist layer is about 2 microns thick.

7. The method of claim 1, wherein the step of aligning an image patterning mask comprises aligning a positive trace image patterning mask.

8. The method of claim 1, wherein the step of aligning an image patterning mask comprises aligning a negative trace image patterning mask.

9. The method of claim 1, wherein the step of forming said electrically conductive layer includes depositing a metal selected from the group consisting of the noble metal listed in New IUPAC Group Numbers 9, 10, or 11 of the Period Table of elements and alloys thereof.

10. The method of claim 9, wherein said step of forming said electrically conductive layer includes depositing a layer of gold.

11. The method of claim 1, wherein said step of forming said electrically conductive layer includes depositing a layer of chromium followed by depositing a layer of gold.

* * * * *